United States Patent
Thompson et al.

(10) Patent No.: US 6,418,945 B1
(45) Date of Patent: Jul. 16, 2002

(54) DUAL CASSETTE CENTRIFUGAL PROCESSOR

(75) Inventors: Raymon F. Thompson; Clif Neil, both of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/611,537

(22) Filed: Jul. 7, 2000

(51) Int. Cl.[7] .................................................. B08B 3/02
(52) U.S. Cl. ...................... 134/140; 134/153; 134/902; 414/940
(58) Field of Search ................ 134/140, 153, 134/902; 118/52, 500; 414/217, 800, 805, 939, 940

(56) References Cited

U.S. PATENT DOCUMENTS

| | | | | |
|---|---|---|---|---|
| 4,300,581 A | * | 11/1981 | Thompson | ............... 134/902 X |
| 4,543,059 A | * | 9/1985 | Whang et al. | ........... 414/940 X |
| 4,911,638 A | * | 3/1990 | Bayne et al. | ............ 414/940 X |
| 5,022,419 A | | 6/1991 | Thompson et al. | |
| 5,107,880 A | * | 4/1992 | Pierson | .................... 134/153 X |
| 5,544,421 A | | 8/1996 | Thompson et al. | |
| 5,888,048 A | * | 3/1999 | Martin et al. | ........... 414/940 X |

OTHER PUBLICATIONS

Drawing—STORM with Surfactant Aspiration—Jul. 10, 2000.

* cited by examiner

Primary Examiner—Philip Coe
(74) Attorney, Agent, or Firm—Lyon & Lyon LLP

(57) ABSTRACT

An apparatus for processing flat media, such as semiconductor wafers, has a rotor including positions for first and second cassettes. The cassettes are restrained within the rotor by support tubes and hold down pins. The processing capacity of the apparatus is increased, as the apparatus can hold two cassettes.

17 Claims, 9 Drawing Sheets

DUAL CASSETTE CENTRIFUGAL PROCESSOR

BACKGROUND OF THE INVENTION

The field of the invention is manufacturing semiconductor devices. More specifically, the invention relates to apparatus and methods for processing flat media, typically semiconductor material wafers.

Semiconductor devices, such as microprocessor chips, memory chips, and a large number of other similar devices are generally manufactured from wafers, or thin round disks, of a semiconductor material such as silicon. The wafers undergo a large number of manufacturing steps, including cleaning steps, typically performed by rinsing and drying, as well as other processing steps where various chemicals in the form of liquids and/or gases are applied to the wafers.

Centrifugal processing has been used for many years, to perform certain steps in the manufacturing of semiconductor devices. Centrifugal processing is generally carried out in a centrifugal processor having a rotor for holding the wafers within a process chamber. Spray manifolds spray process liquids or gases onto the wafers. The rotor is rotated at high speed, at certain times during the centrifugal processing. This rotation of the wafers provides more uniform distribution of the process chemicals onto the wafers, as well as removal of liquid chemicals from the wafers, via centrifugal force.

Centrifugal processing may also be used with other devices manufactured from or on a flat substrate. These devices include photomasks and other optical devices, memory disks and media, and similar substrates. These various flat media are collectively referred to here as "semiconductor wafers".

Semiconductor wafers are manufactured in a highly specialized factory or fabrication facility known as a "fab". Due to the extremely high costs of building and operating the fab, manufacturing efficiency or throughput of wafers is very important. As a result, there is a need for machines and methods for providing faster or more efficient wafer processing. In addition, wafer processing in the fab requires use of various chemicals which may be costly to buy, and which require special handling after they have been used. As a result, there is also a need to reduce the amount of process chemicals required in processing semiconductor wafers.

Accordingly, it is an object of the invention to provide improved apparatus and methods for centrifugally processing semiconductor wafers.

SUMMARY OF THE INVENTION

To these ends, in a first aspect of the invention, a centrifugal semiconductor wafer processor has a rotor within a process chamber. The rotor is designed to hold two cassettes containing wafers. The rotor has a back or first cassette position, towards the back of the rotor, and a front or second cassette position, towards the front of the rotor. The processing capacity of the centrifugal processor is increased (by a factor of 2), by providing positions in the rotor for two cassettes.

In a second and separate aspect of the invention, the rotor has a pair of spaced apart lower cassette support tubes or rails, and a pair of spaced apart lateral cassette support tubes or rails, attached to a front ring, a center ring, and a back plate. The first or back cassette position, for holding a first cassette, is formed approximately between the back plate and center ring, while the front cassette position, for holding a second cassette, is generally formed between the center ring and front ring. The lower cassette support tubes preferably extend continuously from the front ring to the back plate. A first cassette is loaded into the rotor and moved towards the back of the rotor until the first cassette contacts a stopping surface. The front or second cassette is then loaded into the rotor and moved toward the back of the rotor until the front cassette contacts the back of the first cassette. As a result, the centrifugal processor can hold and process an increased number of wafers, within a single processing cycle.

In a third and separate aspect of the invention, the lower cassette support tubes support lower sidewalls of the cassettes. The lateral cassette support tubes preferably support an upper surface of the cassettes, so that the cassettes are secured into position within the rotor. The cassettes can be quickly and easily loaded into and removed from the rotor. The cassettes are secured into position within the rotor by the support tubes, without any need for moving, securing or supporting components.

A centrifugal processor holding three or more cassettes may also be achieved using the inventive principles described.

The invention resides in the described features, as well as in subcombinations of those features. Other objects and advantages will appear below.

BRIEF DESCRIPTION OF THE DRAWINGS

In the drawings, wherein the same reference number indicates the same element, throughout the several views.

DETAILED DESCRIPTION OF THE DRAWINGS

Figure 1:
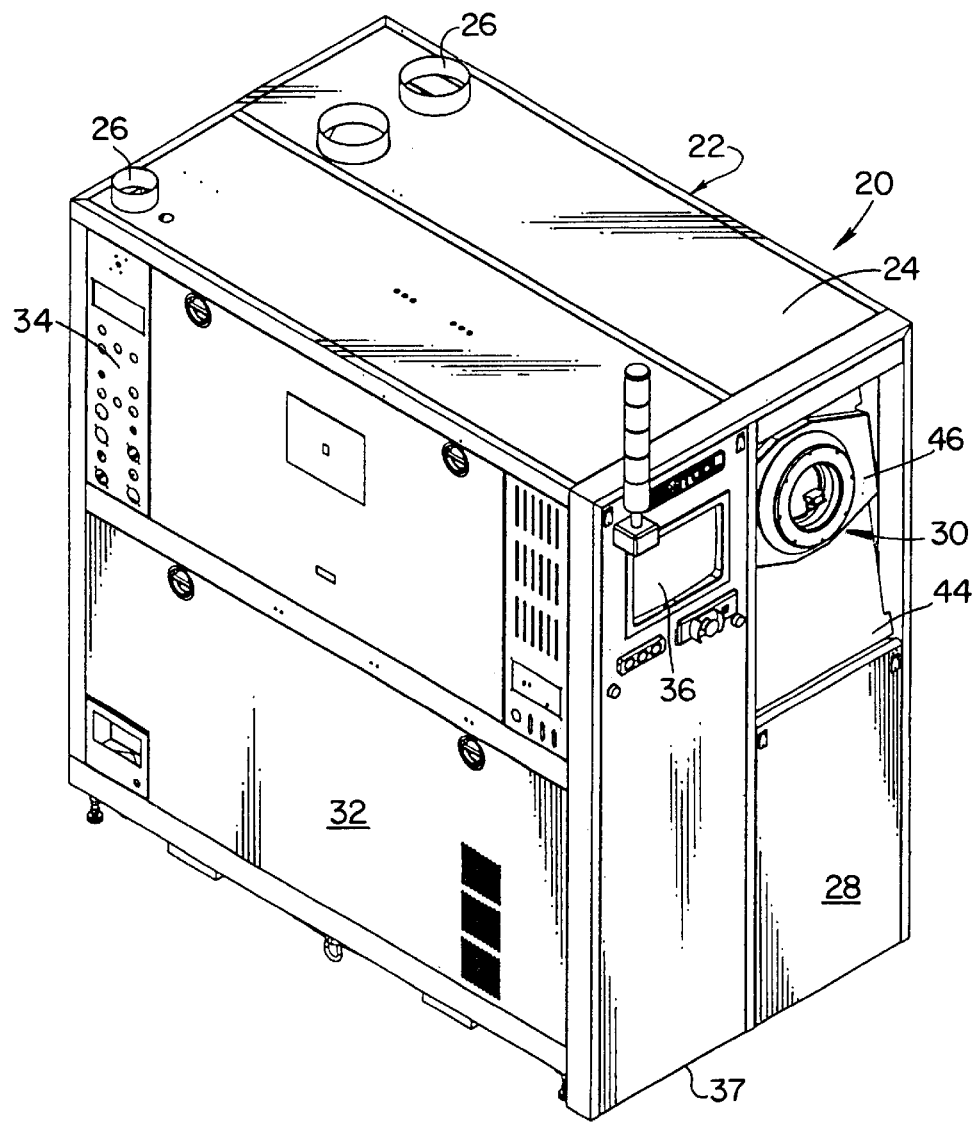
FIG. 1 is a perspective front, top, and right side view of the present centrifugal processor.
Figure 2:
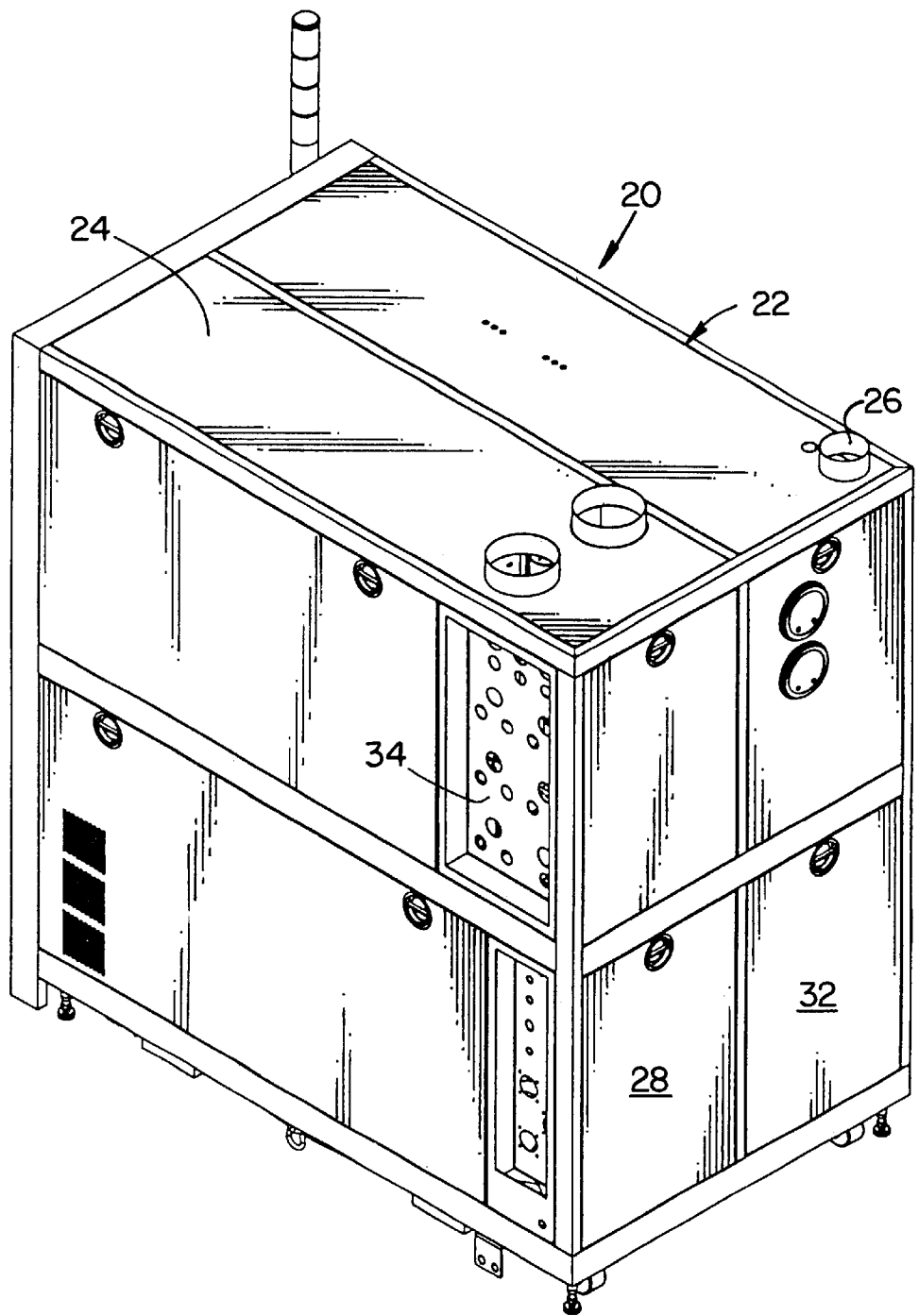
FIG. 2 is a top, back, and right side perspective view of the centrifugal processor shown in FIG. 1.
Figure 3:
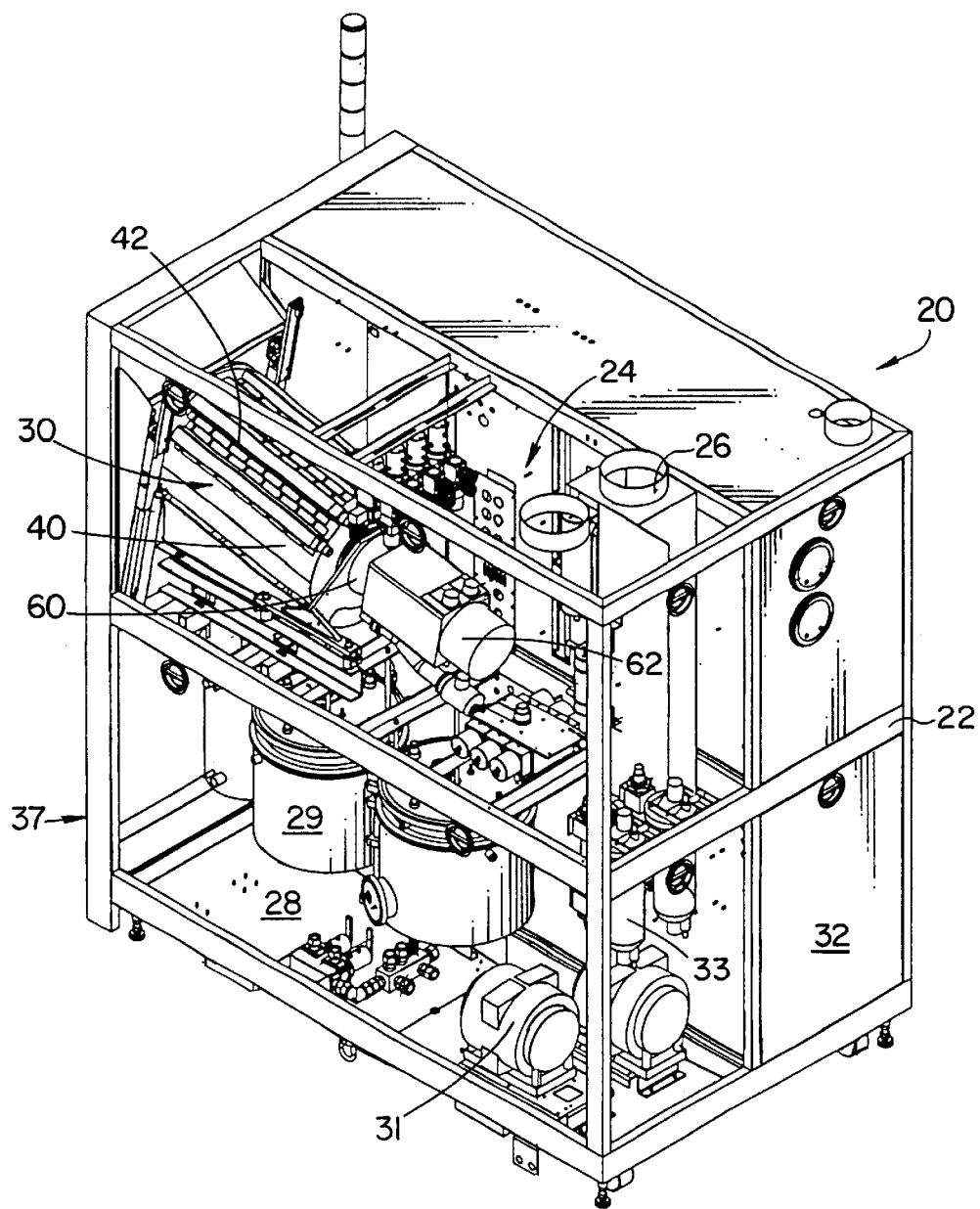
FIG. 3 is the same view as shown in FIG. 2, but with cabinet panels removed, for purposes of illustration.

Turning now in detail to the drawings, as shown in FIGS. 1–3, a centrifugal processing machine or apparatus 20 has a process chamber assembly 30 within a process chamber compartment 24 of a cabinet assembly 22. A process fluid storage compartment 28 is provided below the process chamber assembly 30. The process fluid storage compartment 28, contains fluid tanks 29, pumps 31, filters 33, and other components for providing process fluids and/or gases to the process chamber assembly 30, as is well known in the art. A power supply compartment 32 contains a power supply and other electrical components. As shown in FIG. 1, the apparatus 20 is supplied with e.g., water, process chemicals, gases, electricity, etc., through a fab or facilities connection panel 34. A control panel and display 36 at the front 37 of the apparatus 20 is used for controlling and monitoring operation of the apparatus 20. Spent gases or vapors are evacuated from the apparatus 20 through exhaust ports 26.

Figure 4:
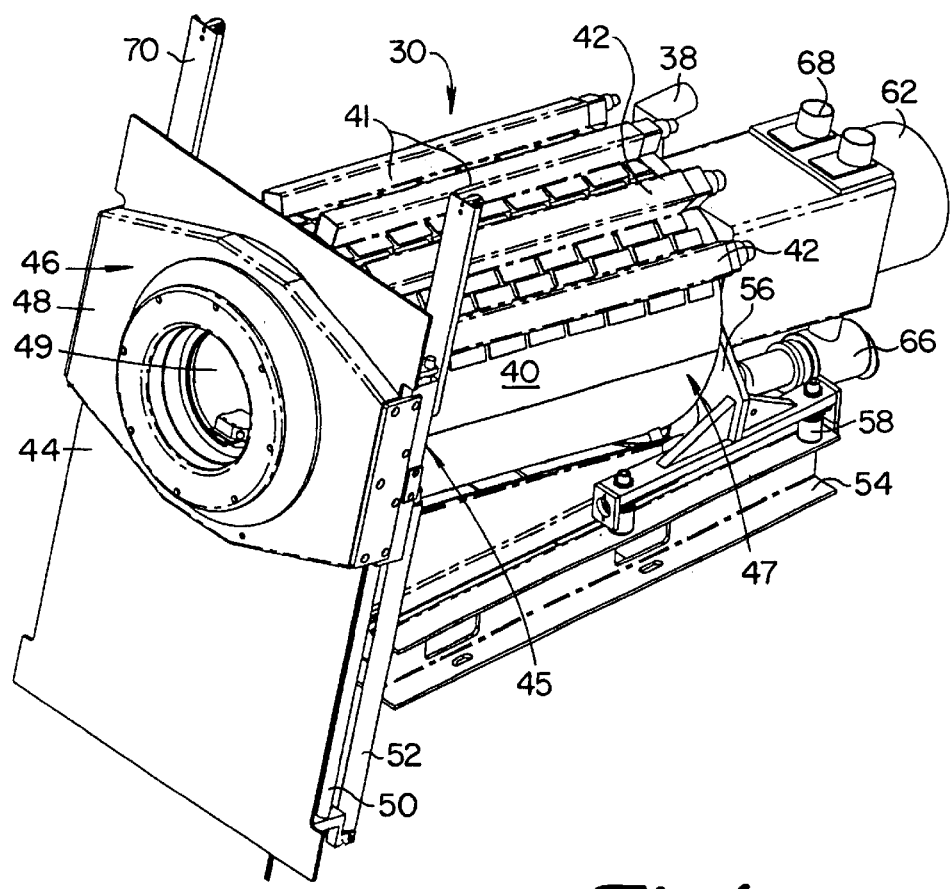
FIG. 4 is a front perspective view of the process chamber assembly shown in FIG.
Figure 5:
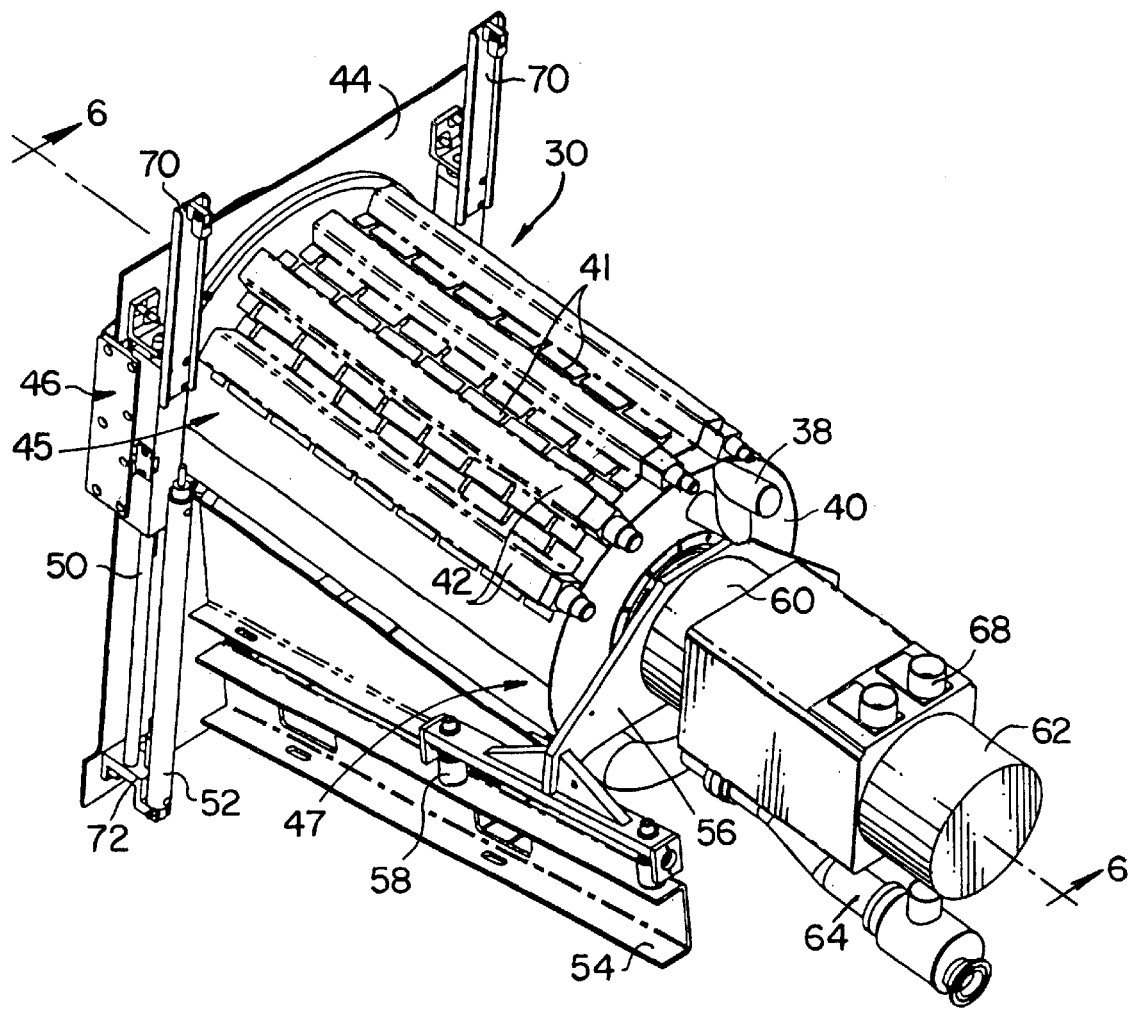
FIG. 5 is a rear perspective view of the process chamber assembly shown in FIG. 4.

Referring now to FIGS. 4 and 5, the process chamber assembly 30 has a cylindrical process chamber or bowl 40. The process chamber 30 is inclined upwardly at an angle of, for example, 5–30°, and preferably about 10°, so that the front end 45 of the process chamber 40 is higher than the back end 47 of the process chamber 40.

The front end 45 of the process chamber 40 is supported on brackets 70, which in turn are attached to the cabinet assembly 22. A front panel 44 around the open front end 45 of the process chamber 40 is attached to the brackets 70.

A door assembly 46 has a door 48 vertically movable along guide rails 50, via linear actuators 52. In FIGS. 4 and 5, the door 48 is shown in the up or closed position, wherein the door 48 closes off, and preferably seals, the open front end 45 of the process chamber 40. During loading and unloading of the process chamber 40, the door 48 is moved to a down or open position, so that the door 48 no longer closes off the open front end 45 of the process chamber 40, and the process chamber can be freely accessed. A window 49 is the door 48 allows for visual inspection within the process chamber 40.

Process chemical spray manifolds 42 and rinse manifolds 41 extend substantially along the entire length of the process chamber 40. The manifolds 41 and 42 have spray nozzles opening into the process chamber 40, for spraying liquids or gases into the process chamber 40. In a typical application, a source of liquid process chemicals, such as acids, or solvents, is connected to the chemical manifolds 42, while a source of de-ionized water is connected to the rinse manifolds 41. A vent 38 exhausts gases or vapors from the chamber 40.

Figure 6:
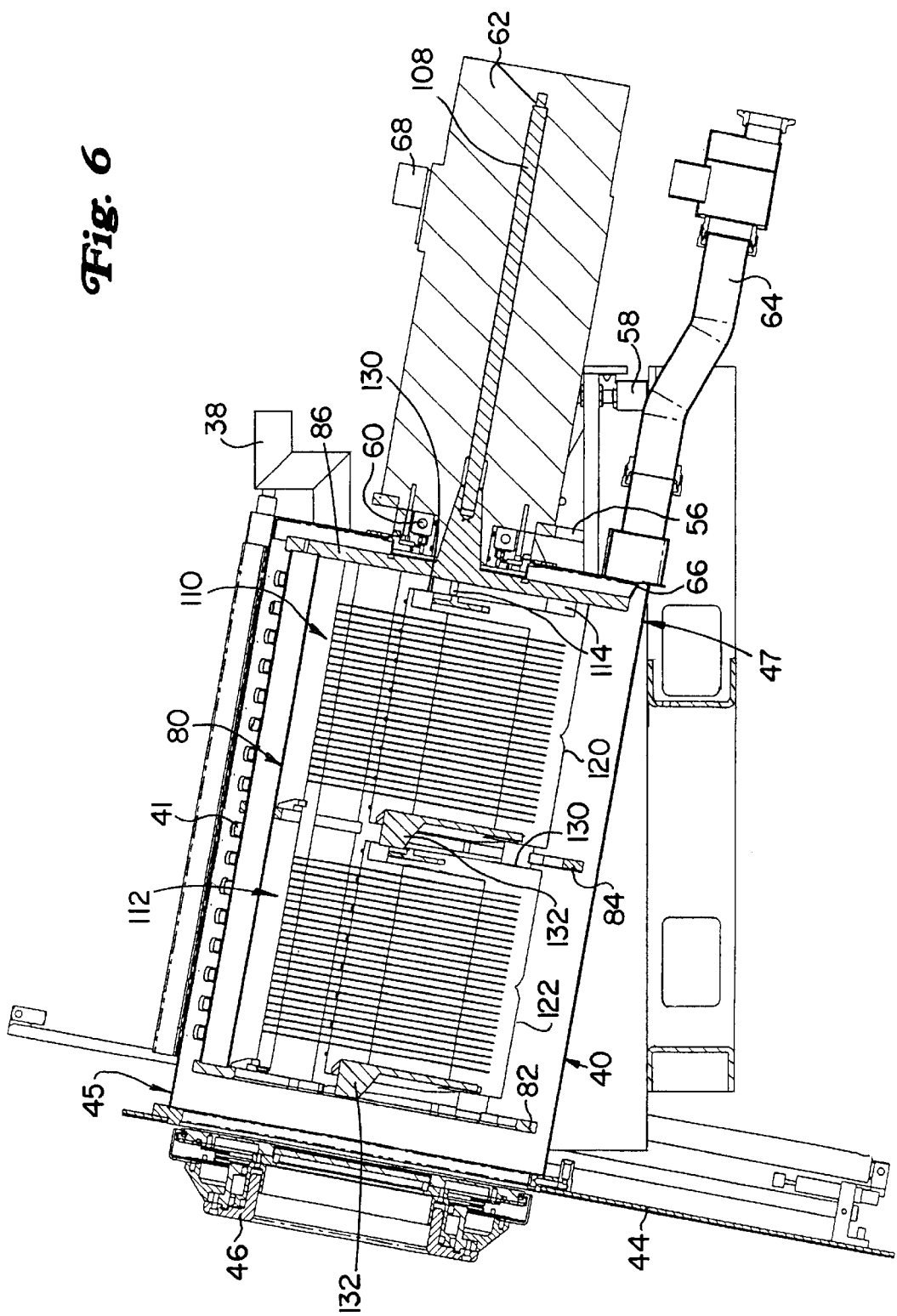
FIG. 6 is a section view of the process chamber assembly shown in FIGS. 4 and 5, and taken along line 6—6 of FIG. 5.
Figure 7:
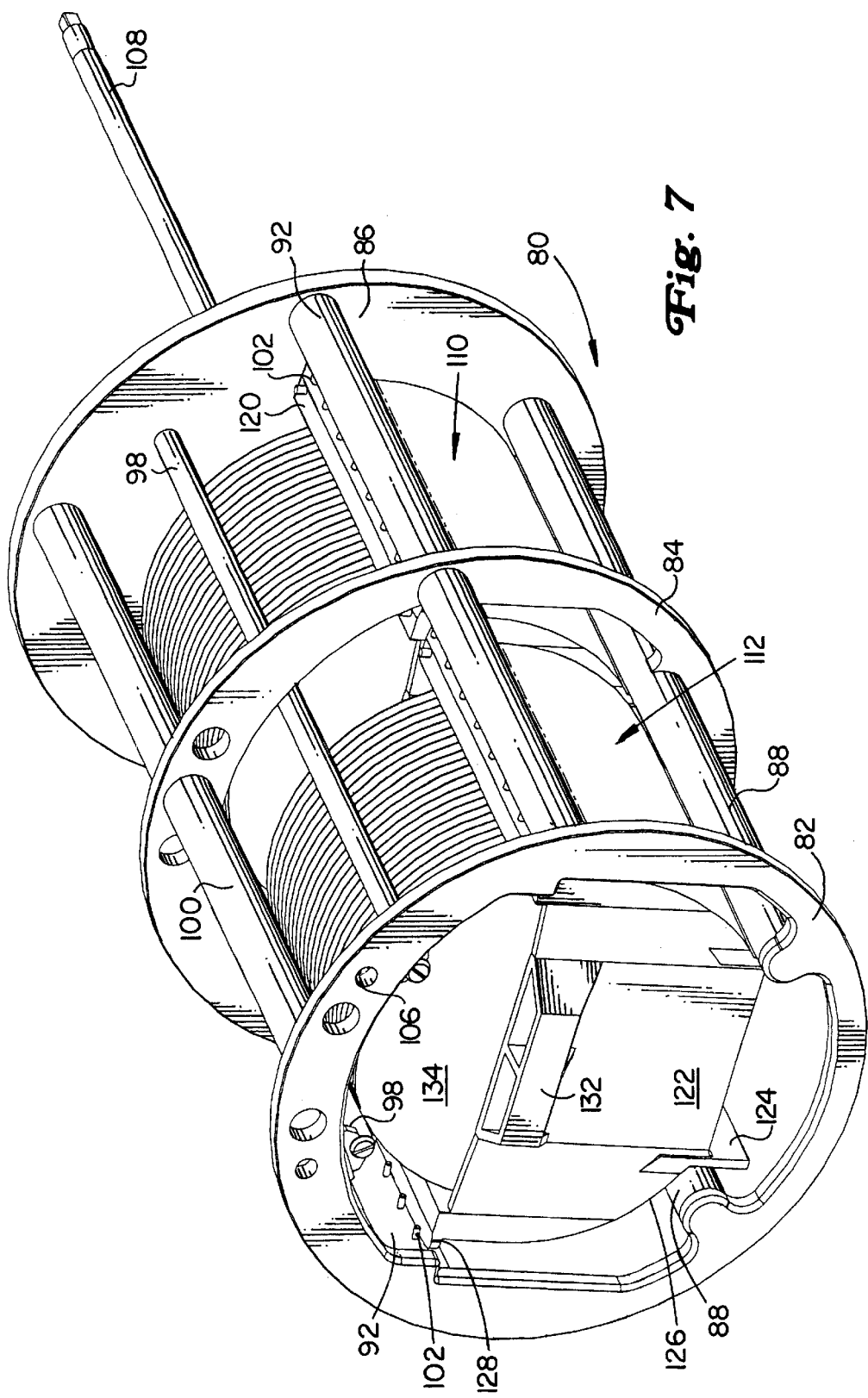
FIG. 7 is a perspective view of the rotor shown in section in FIG. 6.

Referring now to FIGS. 6 and 7, a rotor 80 is rotatably supported within the process chamber 40. A drive shaft 108 extends from the back of the rotor 80 into a motor 62. Power cables (not shown) provide electrical power and controls to the motor 62 via connectors 68. The back end 47 of the process chamber 40 is sealed with a seal assembly 60. A motor mount 56 supports the seal assembly 60, and in turn supports the back end 47 of the process chamber 40, as well as the motor 62. The motor mount 56 is supported on vibration isolators 58 attached to support beams 54, which in turn are attached to the cabinet assembly 22. A drain port 66 at the bottom of the back end of the process chamber 40 is connected to a drainpipe 64, which drains spent liquid from the process chamber 40.

Figure 8:
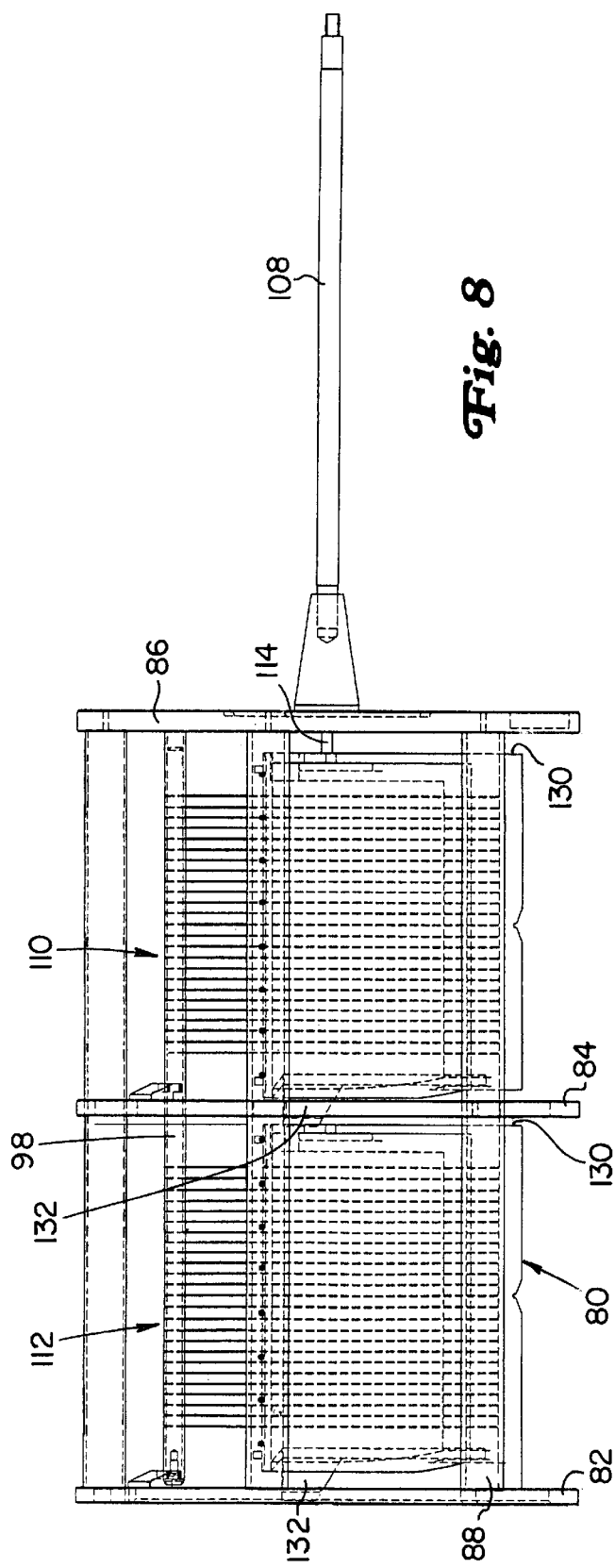
FIG. 8 is a side elevation view of the rotor show n in FIG. 7.
Figure 9:
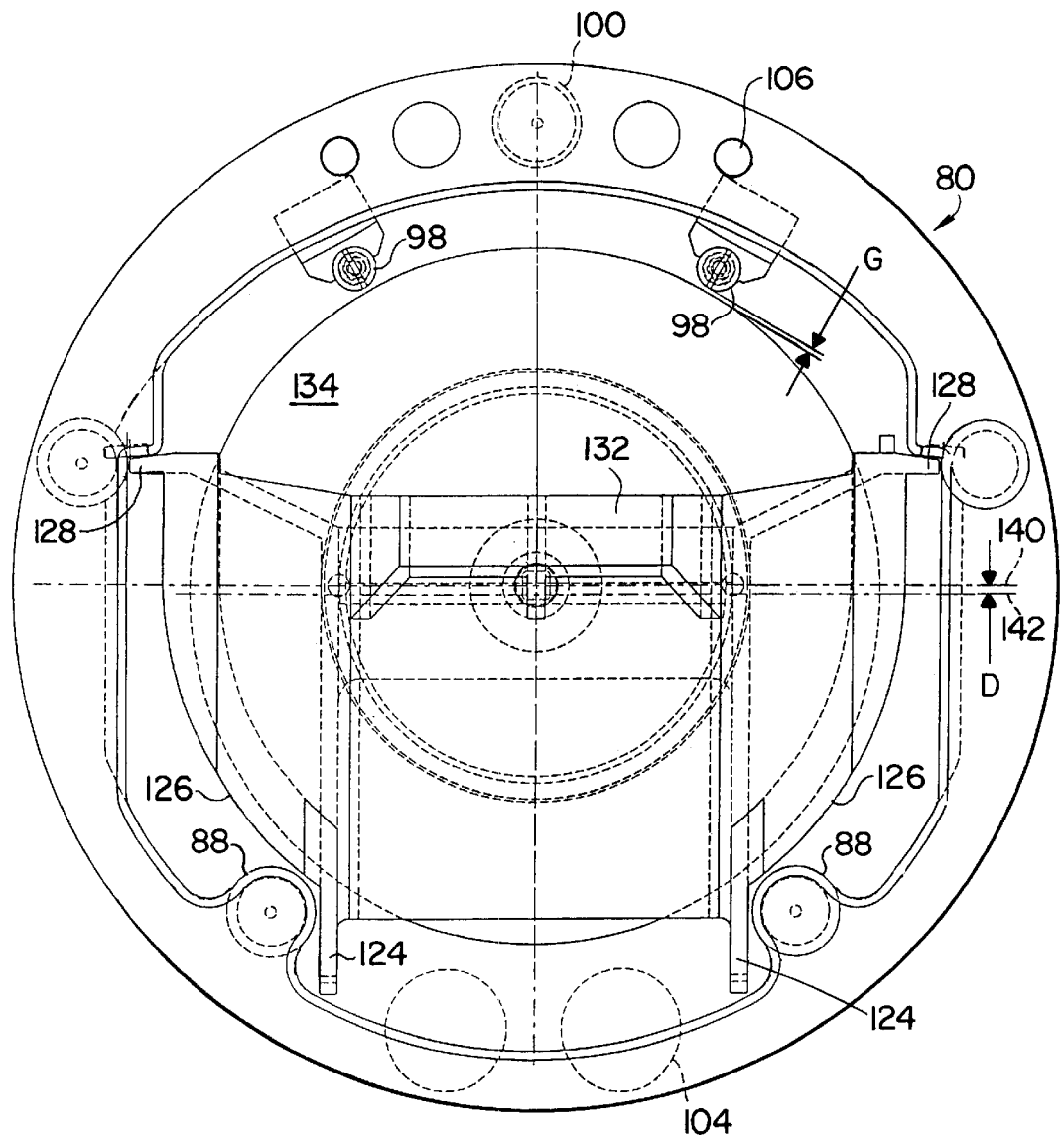
FIG. 9 is a front elevation view of the rotor shown in FIGS. 7 and 8.

Referring now to FIGS. 7, 8 and 9, the rotor 80 has a first or back cassette position 110 and a second or front cassette position 112. As a result, the rotor 80 can hold two cassettes, a first cassette 120, and a second cassette 122. The wafers 134, or other flat media, are held within slots or wafer positions within each cassette. Typically, the cassettes hold, for example 25 wafers. The wafers 134 are spaced apart from each other within the cassette, to allow processing fluids and/or gases to contact all surfaces of the wafers. The cassettes are generally standard components available from various manufacturers, although the size, shape and features of different types of cassettes may vary. The rotor 80 is adapted to hold a specific cassette (model number) from a specific manufacturer. Thus, the features and dimensions of the rotor 80 are adapted to the specific size, shape and features of the cassettes selected for use with the apparatus 20.

For ease of design, manufacture, and use, the first cassette 120 is preferably of the same design as the second cassette 122, so that the first and second cassettes positions 110 and 112 within the rotor 80 may be the same. Although the invention contemplates any rotor having positions for first and second cassettes, regardless of whether the cassettes are of the same design, using two of the same cassettes allows the first and second cassette positions 110 and 112 to be same, allows the rotor to be generally symmetrical on either side of the center ring 84, and makes the loading sequence of the cassettes 120 and 122 irrelevant.

Referring still to FIGS. 7, 8 and 9, the rotor has a front ring 82, a center ring 84, and a back plate or ring 86. A pair of lower cassette support tubes or bars 88 extend from the front ring 82 to the back plate 86, and are also preferably attached to the center ring 84. Similarly, a pair of spaced apart lateral cassette support tubes 92 extend between the front ring 82 and back plate 86, and are also attached to the center ring 84. The lower support tubes 88 and lateral support tubes 92 attached to the front, center and back rings 82, 84, and 86 form the structure of the rotor 80. A pair of retainer bars 98 also extend from the front ring 82 to the back ring 86. A top rotor tube 100 may also be attached to the front, center and back rings 82, 84, and 86, for added structural strength and/or balance.

As shown in FIGS. 7 and 9, the lower support tubes 88 form surfaces for supporting lower sidewalls 126 of the cassettes 120, 122. A plurality of spaced apart hold down pins 102 extend inwardly towards each other, from each of the lateral cassette support tubes 92. The hold down pins 102 are positioned just above side ledges 128 of the cassettes 120, 122. Consequently, the cassettes 120, 122 are secured in place within the rotor 80. The cassettes 120, 122 may also have feet 124. The lower cassette support tubes 88 are then preferably spaced apart so that the legs 124 fit just to the inside of the support tubes 88, to provide additional lateral support.

Rotational balance features, such as counterbores 104 and holes 106 are preferably added, after the rotor 80 is fabricated and tested, so that the rotor 80 is rotationally balanced in use.

Depending upon the chemicals to be used within the apparatus 20, the rotor 80 (as well as other components exposed to the chemicals) may either be made as a stainless steel weldment, or alternatively the rotor material may be Teflon (fluorine containing resins).

In use, wafers 134 are contained in cassettes 120 and 122. As best shown in FIG. 6, the cassettes 120, 122, in the embodiment shown, have a flat back surface 130, and a handle 132 protruding from the front surface of the cassette, as well as the legs 124 and side ledges 128, as shown in FIG. 7. The door 48 of the apparatus 20 is opened, and moves down, to provide access into the process chamber 40. The first cassette 120 is lifted and placed into the rotor 80, with the side walls 126 resting on the lower cassette support tubes 88, and with the side ledges 128 under the hold down pins 102. Referring to FIG. 9, the edges of the wafers 134 are spaced slightly apart from the retainer bars 98 by a small gap G, typically from about 0.025–0.075 inches, and preferably about 0.050 inches. The first cassette 120 is moved towards the back of the rotor 80, until it can be moved no further. Specifically, the back surface 130 of the first cassette 120 contacts a stopping surface 114, shown in FIGS. 6 and 8. As the rotor 80 is positioned on an inclined angle, as shown in FIG. 4, the first cassette 120 moves down into and is seated into the first cassette position 110, within the rotor 80, with some assistance by gravity.

The first or back cassette position 110 is formed between the center ring 84 and back ring 86, as well as between the lower and lateral support tubes 88 and 92.

With the first cassette 120 installed within the rotor 80, the operator then loads the second cassette 122 into the rotor 80, following the same procedure. The second cassette 122 is moved into the rotor 80 until it can be moved no further towards the back. With reference to FIGS. 6 and 8, in the embodiment shown, the back surface 130 of the second cassette 122 comes to rest against the handle 132 of the first cassette 120. At the same time, with reference to FIG. 6, the handle 132 of the second cassette 122 is approximately flush with the front surface of the front ring 82.

The operator then closes the door 48. A processing sequence can be preprogrammed into the apparatus 20, or set up or selected by the operator using the control panel and display 36. Processing fluids and/or gases are sprayed out from the manifolds 42, while the motor 62 spins the rotor 80, followed by rinsing (typically using de-ionized water sprayed from the rinse manifolds 41) and drying, as is well known in semiconductor manufacturing.

Referring to FIGS. 6, 7 and 8, the back and front cassette positions 110 and 112 are continuous with each other, with no structure or other features necessarily physically separating them. The description of the cassette positions 110 and 112 is provided for purposes of explanation.

As the rotor 80 rotates within the process chamber 30, the cassettes 120 and 122 are held in place within the rotor 80 by the hold down pins 102 and the lower cassette support tubes 88. The wafers 134 rest within the cassettes 120 and 122 purely via gravity, when the cassettes 120 and 122 are in the upright position. The cassettes have no features for otherwise holding or restraining the wafers 134.

As the rotor 80 begins to rotate, the wafers 134 can shift slightly out of the cassettes, until the edges of the wafers contact the retainer bars 98. The cassettes may also be able to shift slightly, due to tolerances, and the clearances which are necessarily provided in the rotor, to insure that all cassettes of a given design will fit into the rotor. Referring to FIG. 9, the rotor 80 and cassettes 120 and 122 are dimensioned so that with the cassettes installed within the rotor, the center (and center of gravity) of the wafers 134 may be positioned along the wafer centerline 142, which is preferably offset from the centerline 140 of the spin axis of the rotor 80, by dimension D, ranging from about 0.0–0.25 inches, and preferably about 0.1 inches. The vertical offset D between the wafer centers 142 and spin axis center 140 creates a centrifugal force on wafers 134. (For some applications, a zero offset and no centrifugal holding force may be desired.) Consequently, as the rotor rotation speed increases, the wafers 134 are held within the cassettes, and the cassettes are held down within the rotor, via centrifugal force. The retainer bars 98 retain the wafers 134 only at lower rotation speeds, typically occurring during the starting and stopping sequences of the rotation of the rotor. The motor 62 is controlled (or a braking system is provided) so that the rotor 80 always stops in the upright or 0° position, as shown FIG. 9.

Other features of the apparatus 20, and its methods of operation, are described in U.S. Pat. Nos. 5,022,419; 5,544,421; 5,660,517 and 5,664,337, incorporated herein by reference.

Thus, a novel apparatus and method have been shown and described. Various modifications may of course be made without departing from the spirit and scope of the invention. The invention, therefore, should not be limited, except by the following claims and their equivalents.

What is claimed is:

1. A machine for processing flat media, comprising:
   a chamber;
   a rotor within the chamber, with the rotor having a front ring, and a back ring, and a pair of lateral support tubes attached to the front ring and the back ring, and with each lateral support tube having at least one hold down, for holding down a cassette placed in the rotor, and a pair of lower support tubes for supporting a lower part of the cassette.

2. The machine of claim 1 with the rotor further comprising a front ring, a center ring, and a back ring, and a plurality of support tubes attaching the front ring, center ring, and back ring together.

3. The machine of claim 2 where the center ring divides the first cassette position from the second cassette position.

4. The machine of claim 2 where the plurality of support tubes includes a pair of lateral support tubes, with each lateral support tube having a plurality of hold down pins extending towards each other to restrain the cassette.

5. The machine of claim 1 further including spaced apart lower support tubes extending within the first and second cassette positions and adapted to support a sidewall of a cassette.

6. The machine of claim 5 further including a pair of spaced apart retainer bars extending between the front ring and the back ring.

7. The machine of claim 1 where the rotor is substantially twice the length of a cassette.

8. The machine of claim 1 further including at least one spray manifold in the process chamber extending along both the first cassette position and the second cassette position.

9. The machine of claim 1 further including spaced apart lower support tubes and adapted to support a sidewall of a cassette.

10. A machine for processing flat media within a cassette comprising:
    a process chamber;
    a rotor rotatably supported within the process chamber, with the rotor having first holding means for holding a lower portion of first and second cassettes against movement in a first direction and having second holding means separate from the first holding means for holding an upper portion of the first and second cassettes against movement in a second direction opposite to the first direction; and
    a motor connected to the rotor.

11. A machine for processing flat media, comprising:
    a process chamber;
    a rotor in the process chamber;
    a motor attached to the rotor, for rotating the rotor in the process chamber;
    with the rotor having a front cassette position adjoining a back cassette position. cassette leg support means for supporting, at least one of legs and lower sidewalls of a cassette placed in the rotor and hold down means for holding a cassette onto the cassette leg support means.

12. A machine for processing flat media comprising:
    a process chamber;
    a rotor in the process chamber, with the rotor including:
       a front ring;
       a back ring;
       at least one lower support tube connecting to the front ring and to the back ring;
       at least one lateral support tube connecting to the front ring and to the back ring;

at least one hold down on the at least one lateral support tube;

with the lower support tube, lateral support tube and the hold down positioned relative to each other to secure a cassette in the rotor, with the hold down engaging a side ledge of the cassette and with the lower support tube engaging at least one of a lower sidewall and a foot of the cassette.

13. A machine for processing flat media, comprising:

a process chamber;

a rotor within the process chamber, with the rotor having a first cassette position and a second cassette position, and a front ring, a center ring, and a back ring, and a pair of lateral support tubes attaching the front ring, center ring, and back ring together, and with each lateral support tube having a plurality of hold down pins extending towards each other to restrain a cassette placed in the rotor; and a motor for spinning the rotor.

14. The machine of claim 13 further including a pair of spaced apart retainer bars extending between the front ring and the back ring.

15. A machine for processing flat media held within a cassette having lower sidewalls, a pair of spaced apart legs extending from the lower sidewalls, and first and second side ledges, comprising:

a chamber;

a rotor within the chamber, within the rotor including:

a pair of lower support tubes spaced apart to allow the legs of the cassette to fit in between the pair of lower support tubes, and with the lower support tubes in contact with and supporting the lower sidewalls of the cassette; and with the rotor also including:

first and second lateral cassette support tubes each having at least one hold down, with the hold down on the first and second lateral cassette support tubes extending over the first and second side ledges of the cassette, respectively; and a spin motor linked to the rotor.

16. A machine for processing semiconductor wafers, comprising:

a chamber;

a rotor in the chamber, with the rotor having a front ring and a back ring, and first and second support bars attached to the front and back rings;

a first cassette in a first cassette position in the rotor, with the first cassette having a back surface in contact with the back ring;

a second cassette in a second cassette position in the rotor, with the second cassette having a back surface in contact with a front surface of the first cassette, and with the first and second support bars in contact with and supporting, at least in part, the first and second cassettes; and a spin motor linked to the rotor.

17. The machine of claim 16 wherein the front surface of the first cassette comprises a handle.

* * * * *